US010085315B2

(12) United States Patent
McMahon (10) Patent No.: US 10,085,315 B2
(45) Date of Patent: *Sep. 25, 2018

(54) SELF-IDENTIFYING SOLID-STATE TRANSDUCER MODULES AND ASSOCIATED SYSTEMS AND METHODS

(71) Applicant: Micron Technology, Inc., Boise, ID (US)

(72) Inventor: Steven A. McMahon, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/626,979

(22) Filed: Jun. 19, 2017

(65) Prior Publication Data

US 2017/0295619 A1    Oct. 12, 2017

Related U.S. Application Data

(63) Continuation of application No. 15/074,276, filed on Mar. 18, 2016, now Pat. No. 9,723,672, which is a continuation of application No. 14/625,501, filed on Feb. 18, 2015, now Pat. No. 9,293,638, which is a continuation of application No. 13/596,437, filed on Aug. 28, 2012, now Pat. No. 8,963,438.

(51) Int. Cl.
| | |
|---|---|
| H05B 33/08 | (2006.01) |
| H01L 33/62 | (2010.01) |
| H01L 33/00 | (2010.01) |
| H01L 25/16 | (2006.01) |

(52) U.S. Cl.
CPC ....... *H05B 33/0827* (2013.01); *H01L 25/167* (2013.01); *H01L 33/005* (2013.01); *H01L 33/62* (2013.01); *H05B 33/0842* (2013.01); *H01L 2933/0066* (2013.01)

(58) Field of Classification Search
CPC ............ H05B 33/0815; H05B 41/3925; H05B 41/232; H05B 41/46
USPC ................................ 315/192, 224, 122, 188
See application file for complete search history.

(56) References Cited

U.S. PATENT DOCUMENTS

| | | | |
|---|---|---|---|
| 7,902,762 B2 * | 3/2011 | Chen ................. | H05B 33/0824 315/209 R |
| 8,963,438 B2 | 2/2015 | McMahon | |

(Continued)

FOREIGN PATENT DOCUMENTS

WO    2006094590    9/2006

*Primary Examiner* — Douglas W Owens
*Assistant Examiner* — Syed M Kaiser
(74) *Attorney, Agent, or Firm* — Perkins Coie LLP (57) ABSTRACT

Self-identifying solid-state transducer (SST) modules and associated systems and methods are disclosed herein. In several embodiments, for example, an SST system can include a driver and at least one SST module electrically coupled to the driver. Each SST module can include an SST and a sense resistor. The sense resistors of each SST module can have at least substantially similar resistance values. The SSTs of the SST modules can be coupled in parallel across an SST channel to the driver, and the sense resistors of the SST modules can be coupled in parallel across a sense channel to the driver. The driver can be configured to measure a sense resistance across the sense resistors and deliver a current across the SSTs based on the sense resistance.

17 Claims, 6 Drawing Sheets

(56) References Cited

U.S. PATENT DOCUMENTS

| | | | |
|---|---|---|---|
| 9,078,315 B2* | 7/2015 | Pantano | H05B 33/0827 |
| 2007/0085489 A1* | 4/2007 | Robinson | H05B 33/0815 |
| | | | 315/224 |
| 2007/0182338 A1* | 8/2007 | Shteynberg | H05B 33/0815 |
| | | | 315/200 R |
| 2008/0018261 A1* | 1/2008 | Kastner | F21V 23/00 |
| | | | 315/192 |
| 2009/0261748 A1* | 10/2009 | McKinney | H05B 33/0812 |
| | | | 315/254 |
| 2010/0033095 A1* | 2/2010 | Sadwick | H05B 33/0809 |
| | | | 315/51 |
| 2010/0109570 A1* | 5/2010 | Weaver | H05B 33/0812 |
| | | | 315/295 |
| 2011/0031955 A1* | 2/2011 | Cheng | G05F 3/16 |
| | | | 323/312 |
| 2011/0068702 A1* | 3/2011 | van de Ven | H05B 33/083 |
| | | | 315/186 |
| 2011/0080110 A1* | 4/2011 | Nuhfer | H05B 33/0815 |
| | | | 315/291 |
| 2011/0080119 A1* | 4/2011 | Yan | H05B 33/0815 |
| | | | 315/307 |
| 2011/0273112 A1* | 11/2011 | Lee, II | H05B 33/0887 |
| | | | 315/297 |
| 2012/0176066 A1* | 7/2012 | Lin | H05B 33/0815 |
| | | | 315/307 |
| 2012/0268021 A1* | 10/2012 | Lee | H05B 33/0815 |
| | | | 315/192 |
| 2013/0082624 A1* | 4/2013 | Brassfield | H05B 33/0818 |
| | | | 315/297 |
| 2013/0147358 A1* | 6/2013 | Kotowski | H05B 33/0818 |
| | | | 315/122 |
| 2014/0062321 A1* | 3/2014 | McMahon | H05B 33/0842 |
| | | | 315/192 |
| 2014/0125230 A1* | 5/2014 | Shteynberg | H05B 33/083 |
| | | | 315/122 |
| 2014/0292202 A1* | 10/2014 | Zhang | H05B 33/0815 |
| | | | 315/127 |
| 2015/0162492 A1 | 6/2015 | McMahon | |
| 2015/0373800 A1* | 12/2015 | Cao | H05B 33/0842 |
| | | | 349/69 |
| 2016/0007420 A1* | 1/2016 | Gong | H05B 33/0815 |
| | | | 315/187 |

* cited by examiner

| SST Module | Sense Resistance (Ω) | Driver Current Output (mA) |
|---|---|---|
| 1 | 1,000 | 350 |
| 2 | 500 | 700 |
| 3 | 333 | 1,400 |
| 4 | 250 | 1,750 |
| 5 | 200 | 2,100 |
| 6 | 167 | 2,450 |
| 7 | 143 | 2,800 |
| 8 | 125 | 3,150 |

SELF-IDENTIFYING SOLID-STATE TRANSDUCER MODULES AND ASSOCIATED SYSTEMS AND METHODS

CROSS-REFERENCE TO RELATED APPLICATION

This application is a continuation of U.S. application Ser. No. 15/074,276 filed Mar. 18, 2016, which is a continuation of U.S. application Ser. No. 14/625,501, now U.S. Pat. No. 9,293,638, filed Feb. 18, 2015, which is a continuation of U.S. application Ser. No. 13/596,437, now U.S. Pat. No. 8,963,438, filed Aug. 28, 2012, each of which are incorporated herein by reference in their entireties.

TECHNICAL FIELD

The present technology relates to solid-state transducer ("SST") modules. In particular, the present technology relates to self-identifying SST modules and associated systems and methods.

BACKGROUND

Figure 1A:
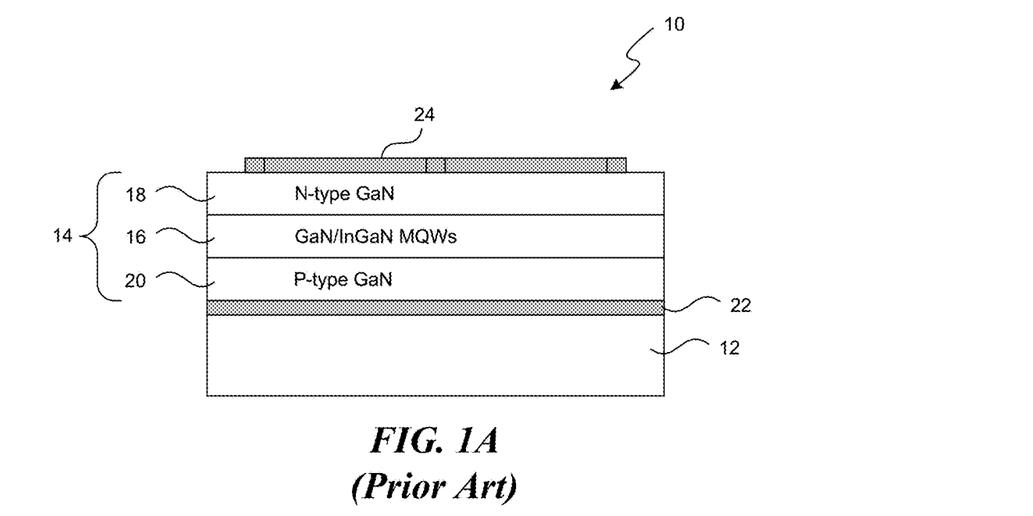
FIG. 1A is a partially schematic cross-sectional diagram of an LED die configured in accordance with the prior art.

Mobile phones, personal digital assistants ("PDAs"), digital cameras, MP3 players, and other electronic devices utilize light-emitting diodes ("LEDs"), organic light-emitting diodes ("OLEDs"), polymer light-emitting diodes ("PLEDs"), and other SST devices for backlighting. SST devices are also used for signage, indoor lighting, outdoor lighting, and other types of general illumination. FIG. 1A is a cross-sectional view of a conventional LED die 10 that includes a substrate 12 carrying an LED structure 14. The LED structure 14 has an active region 16, e.g., containing gallium nitride/indium gallium nitride (GaN/InGaN) multiple quantum wells ("MQWs"), positioned between N-type GaN 18 and P-type GaN 20. The LED die 10 also includes a first contact 22 on the P-type GaN 20 and a second contact 24 spaced vertically apart from the first contact 22 on the front surface of the N-type GaN 18. The second contact 18 typically includes a transparent and conductive material (e.g., indium tin oxide ("ITO")) to allow light to escape from the LED structure 14. In other conventional LED devices, the first and second contacts 22 and 24 are spaced laterally apart from one another on the same side of the LED structure 14 and/or both contacts 22, 24 may be positioned at the back side of the LED structure 14.

Figure 1B:
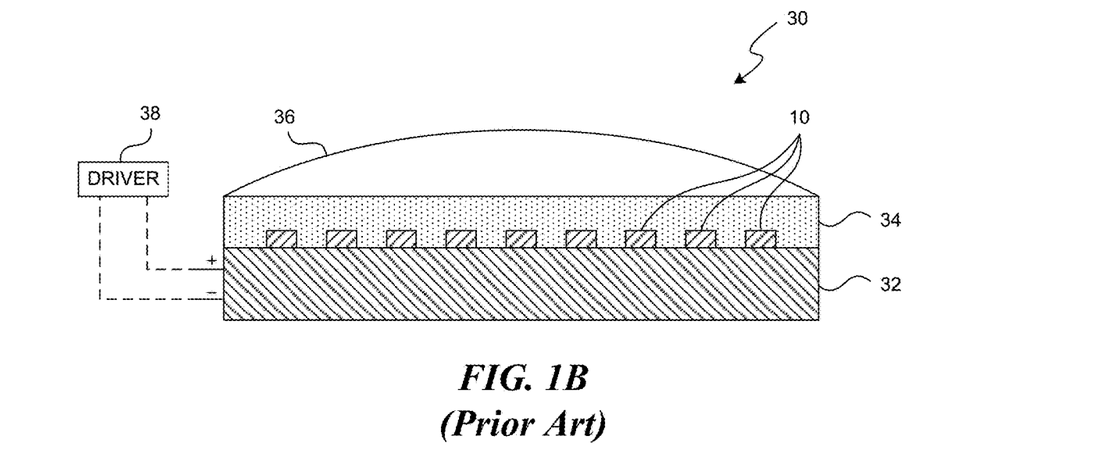
FIG. 1B is a partially schematic cross-sectional diagram of an LED module configured in accordance with another embodiment of the prior art.

LED dies (e.g., the LED die 10 shown in FIG. 1A) can be coupled together in an LED module and connected to an LED driver to form an LED light fixture or luminaire. For example, FIG. 1B is a partially schematic cross-sectional view of a conventional LED module 30 including a substrate 32 carrying a plurality of LED dies 10, a converter material 34 (e.g., phosphor) that manipulates the color of light emitted by the LED dies 10, and an encapsulant or lens 36 over the LED dies 10. The LED dies 10 are connected to a common anode and cathode, which are in turn coupled to an LED driver 38 (shown schematically) that can supply current to drive the LED module 30. Additional LED modules 30 can be electrically coupled to the LED driver 38 in an LED light fixture or luminaire.

LED drivers are typically selected based on the quantity of LED modules in the luminaire and/or the operating parameters of the individual LED modules such that the driver supplies the appropriate level of current across the LED modules. If a change is made to the number of LED modules in a luminaire, a new driver must be matched to the new configuration. Accordingly, LED manufacturers must stock numerous LED drivers with incrementally increasing voltage and current outputs to match different luminaire configurations. Modifications to the circuitry connecting the LED modules to the driver may also be made to distribute the appropriate level of current across the LED modules. For example, a change in the number of LED modules may require an engineer to determine the resistance that needs to be added to the circuit to accommodate the specific configuration of the luminaire, and then the appropriate resistor must be added in the LED circuit.

Other LED luminaires include what is known as an "intelligent driver" that can recognize changes in the quantity or type of LED modules in the luminaire and adjust current output settings accordingly. Such drivers include switch mode power supplies, dedicated analog circuits, and/or dedicated memory circuits (e.g., flash memory) that identify the LED module configuration of the luminaire and adjust the current output accordingly. However, because LED drivers are already one of, if not the most expensive component in LED luminaires, the complex features of intelligent drivers only further increases the overall manufacturing cost of LED luminaires.

DETAILED DESCRIPTION

Specific details of several embodiments of self-identifying SST modules and associated systems and methods are described below. The term "SST" generally refers to solid-state transducers that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can also include solid-state devices that convert electromagnetic radiation into electricity. A person skilled in the relevant art will also understand that the technology may have additional embodiments, and that the technology may be practiced without several of the details of the embodiments described below with reference to FIGS. 2A-5.

Figure 2A:
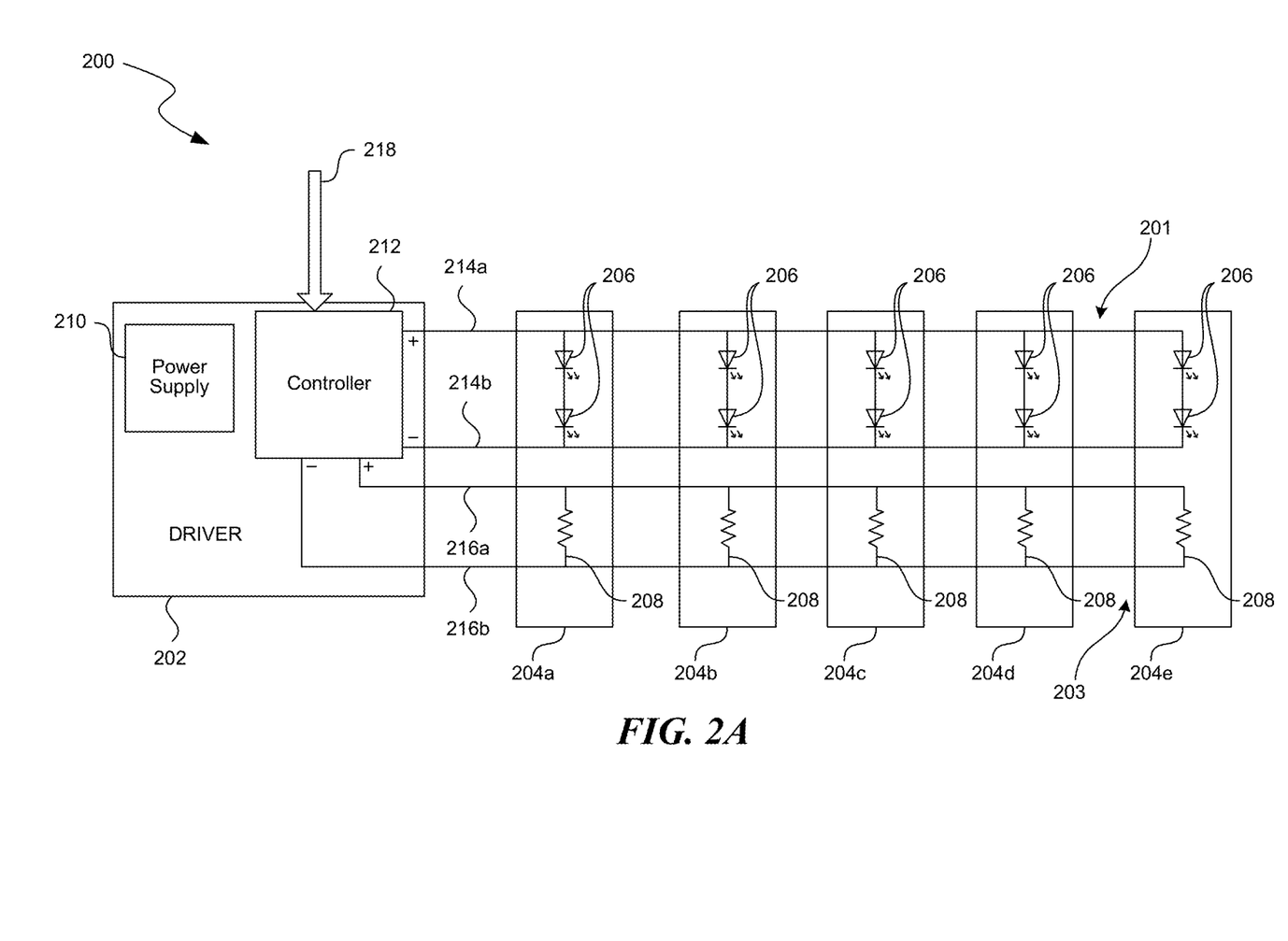
FIG. 2A is a partially schematic circuit diagram of an SST system configured in accordance with embodiments of the present technology.

FIG. 2A is a partially schematic circuit diagram of an SST system 200 configured in accordance with embodiments of the present technology. The SST system 200 can include a driver 202 operably coupled to a plurality of SST modules (identified individually as first through fifth SST modules 204a-e, respectively, and referred to collectively as SST modules 204). The driver 202 can include a power supply 210 and a constant current controller 212. As shown in FIG. 2A, each of the SST modules 204 can include one or more SSTs 206 (illustrated as LEDs) and a sense resistor 208. The SSTs 206 of the SST modules 204 can be electrically coupled in a first parallel circuit 201 to the constant current controller 212 via an SST input channel 214a and an SST return channel 214b (referred to collectively as SST channels 214). The sense resistors 208 can be electrically coupled in separate second parallel circuit 203 to the constant current controller 212 via a sense input channel 216a and a sense return channel 216b (referred to collectively as sense channels 216). In operation, the constant current controller 212 can use the total resistance measured across sense resistors 208 to identify the number of SST modules 204 coupled to the driver 202 and supply a corresponding level of current across the SSTs 206 via the SST channels 214.

As shown in FIG. 2A, the SST system 200 can include five SST modules 204 that are coupled together in parallel via the first and second circuits 201 and 203. In other embodiments, however, the SST system 200 can include fewer than five SST modules 204 (e.g., one SST module 204) or more than five SST modules 204. Regardless of the number of SST modules 204 in the SST system 200, the individual SST modules 204 receive substantially equal current inputs because they are coupled in parallel with one another. As such, the SST system 200 can generate substantially uniform emissions (e.g., light) across all of the SST modules 204.

In the embodiment illustrated in FIG. 2A, each of the SST modules 204 includes two SSTs 206 coupled together in series. However, in other embodiments the individual SST modules 204 can include a single SST 206 or more than two SSTs 206 (e.g., an array of SSTs 206) coupled together in series or in parallel. The individual SSTs 206 can include a first semiconductor material, an active region, and a second semiconductor material stacked sequentially on one another and formed using metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques known in the art. The first semiconductor material can include a P-type semiconductor material (e.g., a P-type gallium nitride ("P—GaN")), and the second semiconductor material can include an N-type semiconductor (e.g., an N-type gallium nitride ("N—GaN")). In selected embodiments, the first and second semiconductor materials can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials. The active region can include a single quantum well ("SQW"), MQWs, and/or a bulk semiconductor material. The term "bulk semiconductor material" generally refers to a single grain semiconductor material (e.g., InGaN) with a thickness between approximately 10 nanometers and approximately 500 nanometers. In certain embodiments, the active region can include an InGaN SQW, GaN/InGaN MQWs, and/or an InGaN bulk material. In other embodiments, the active region can include aluminum gallium indium phosphide (AlGaInP), aluminum gallium indium nitride (AlGaInN), and/or other suitable materials or con-figurations. In various embodiments, the SSTs 206 can be configured to emit light in the visible spectrum (e.g., from about 390 nm to about 750 nm), in the infrared spectrum (e.g., from about 1050 nm to about 1550 nm), and/or in other suitable spectra.

Each SST module 204 can include one sense resistor 208, and all the sense resistors 208 in the SST system 200 can have at least substantially similar resistances. For example, the individual sense resistors 208 may each have a resistance of 1 kΩ with a 5% tolerance. In other embodiments, the sense resistors 208 may have higher or lower resistances and/or lower or higher tolerances (e.g., a 1% tolerance). Because each sense resistor 208 (and therefore each SST module 204) has a substantially identical resistance, the constant current controller 212 can associate the change in sense resistance due to the addition of a sense resistor 208 in the second parallel circuit 203 with the addition of an SST module 204 to the SST system 200. In certain aspects of the technology, the resistance of each sense resistor 208 may be substantially higher than the wire, trace, and connection resistance of the second parallel circuit 203 such that the constant current controller 212 can distinguish between the circuit resistance and the addition or removal of a parallelly coupled sense resistor 208. For example, the individual sense resistors 208 may have a resistance of about 1 kΩ or higher. In other embodiments, the individual SST modules 204 may include more than one sense resistor 208, but still be configured such that the total sense resistance of each SST module 204 in the SST system 200 is substantially similar.

The sense resistors 208 can be positioned virtually anywhere in the SST system 200. For example, the sense resistors 208 can be positioned under a lens that encapsulates the SSTs 206 (e.g., the lens 36 shown in FIG. 1B) or outside the lens on the same substrate as the SSTs 206. The sense resistors 208 may also be incorporated into an SST device (e.g., including the SSTs 206) and electrically coupled (e.g., wirebonded) to an external contact pad (e.g., in a similar fashion as an embedded electrostatic discharge (ESD) protection diode). In other embodiments, the sense resistors 208 can also be positioned external to the array of SSTs 206 on a printed circuit board and/or elsewhere in the SST system 200.

As discussed above, the sense resistors 208 and the SSTs 206 can be electrically coupled to the driver 202 via separate parallel circuits 201, 203. The driver 202 can include one or more channels. Each channel can have a unique sense input or, in embodiments with multi-channel drivers, the channels can operate off of a single sense input to set the current of all the channels. For example, in the embodiment illustrated in FIG. 2A, the driver 202 includes multiple channels (e.g., SST and sense channels 214 and 216) such that the constant current controller 212 can use the sense input from the sense channels 216 to set the current across the SST channels 214. Therefore, the sense channels 216 allow the constant current controller 212 to measure changes in sense resistance across the second parallel circuit 203 (i.e., the total resistance of the sense resistors 208 coupled in parallel), and automatically adjust the current supplied across the SST channels 214 in response to the changed sense resistance. In various embodiments, the driver 202 can include an analog or digital circuit that associates the changes in sense resistance with a proportional current output corresponding to the number of SST modules 204 in the SST system 200.

The driver's power supply 210 may be configured to convert an AC input voltage to a DC output voltage that can drive the SST modules 204. In other embodiments, the power supply 210 may have other suitable configurations, such as a DC/DC power supply. The constant current controller 212 can control the level of power received from the power supply 210 to drive the SST modules 204 at an at least substantially constant level of current.

In various embodiments, the SST system 200 may further include a control circuit 218 (indicated by an input arrow) that is operably coupled to the constant current controller 212. The control circuit 218 can control the intensity of light and/or other emissions generated by the SSTs 206 (e.g., using 0-10 V DC control signals). For example, the control circuit 218 may use Digital Addressable Lighting Interface (DALI) dimming, Digital Multiplex (DMX) dimming, triac dimming, and/or other suitable intensity control interfaces known to persons skilled in the art to provide emission control.

Several embodiments of the SST system 200 shown in FIG. 2A can adjust the amount of current supplied to the SST modules 204 based on the sense resistance measured by the constant current controller 212. For example, when the first SST module 204a is electrically coupled to the driver 202, the SSTs 206 are electrically coupled to the constant current controller 212 in the first circuit 201 via the SST channels 214, and the sense resistor 208 is electrically coupled to the constant current controller 212 in the second circuit 203 via the sense channels 216. The constant current controller 212 measures the resistance of the single sense resistor 208 (e.g., 1 kΩ), and delivers a proportional level of current (associated with one SST module 204) to the SSTs 206 in the first circuit 201 via the SST channels 214. As shown in the chart in FIG. 2B, if the driver 202 has a minimum output current is 350 mA, the driver 202 delivers 350 mA when one SST module 204 is connected to the driver 202.

When the second SST module 204b is connected to the driver 202, the SSTs 206 are connected in parallel with the SSTs 206 of the first SST module 204a in the first circuit 201, and the sense resistors 208 of the first and second SST modules 204a and 204b are connected in parallel in the second circuit 203. As discussed above, all of the sense resistors 208 have substantially identical resistances, and therefore the addition of the second SST module 204 causes the sense resistance measured by the constant current controller 212 to decrease by half (e.g., from 1 kΩ to 500Ω). This reduction in sense resistance indicates to the constant current controller 212 that a second SST module 204 has been added to the system 200. In response, the driver 202 supplies double the amount of current (e.g., 700 mA) across the SST modules 204 such that two parallelly coupled SST modules 204 are supplied the same level of current (e.g., 350 mA). Electrically coupling additional SST modules 204 to the driver 202 results in corresponding reductions in the sense resistance measured by the constant current controller 212, and thereby triggers proportional increases in the amount of current delivered to the SSTs 206 in the first circuit 201. The chart shown in FIG. 2B, for example, illustrates the incremental decreases in sense resistance and corresponding increases in driving current as eight SST modules are coupled to a 350 mA minimum current output driver.

Figure 2B:
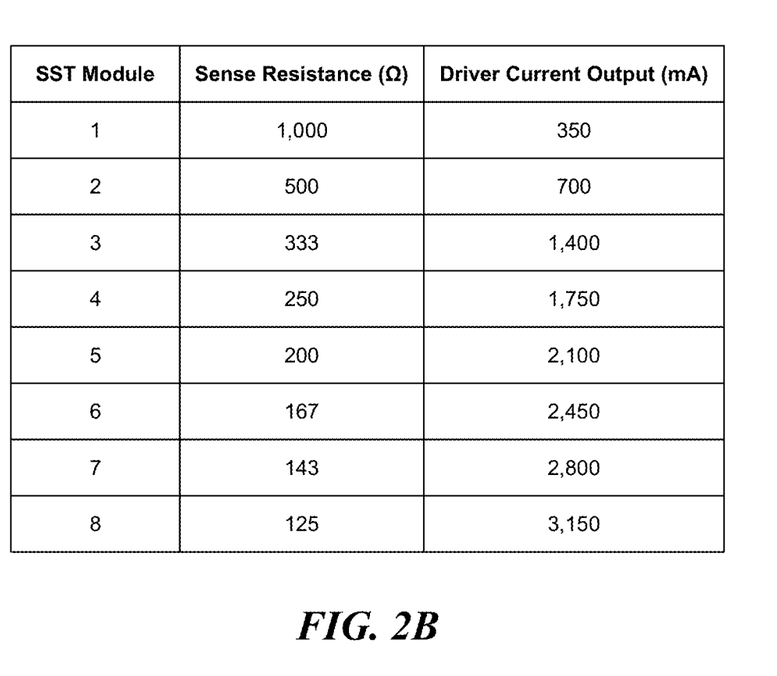
FIG. 2B is a table illustrating changes in driver output currents corresponding to the number of SST modules in an SST system in accordance with embodiments of the present technology.

As shown in FIG. 2B, the change in measured sense resistance becomes increasingly smaller as additional SST modules 204 are added to the SST system 200 because the sense resistors 208 are coupled in parallel. Accordingly, a practical limit with respect to the maximum number of SST modules 204 in the SST system 200 may arise based on the sensitivity of the constant current controller 212. For example, if the constant current controller 212 has a sensitivity of 10 Ω (i.e., able to distinguish between 10 Ω changes in resistance), the practical limit for the driver represented in FIG. 2B may be eight SST modules 204. In other embodiments, the sense pin of the constant current controller 212 may be more accurate (e.g., able to sense as little as 0.10 Ω differences in resistance), and therefore more SST modules 204 may be coupled to the driver 202. Practical limits as to the number of SST modules 204 in the SST system 200 may also arise because the maximum current that the driver 202 can supply to the SST modules 204 may be limited.

In operation, the driver 202 can automatically adjust the driving current output for the number of SST modules 204 attached thereto based simply on the SST modules 204 as they are added to and/or removed from the second circuit 203. Accordingly, SST system manufacturers no longer need to stock a plurality of different drivers with incrementally differing voltage and/or current levels (e.g., 30 V, 35V, 40V, etc) that must be matched to specific SST system configurations. Instead, the SST system 200 allows manufacturers to stock one type of driver that automatically matches its current output based on the input received (i.e., the sense resistance) from the self-identifying SST modules 204 as they are connected to or disconnected from the second circuit 203. The flexibility provided by the SST system 200 does not come from the addition of expensive switching circuits, potentiometers, and/or memory circuits to the driver 202 (e.g., as is the case in so-called "intelligent" drivers). Rather, it is the SST modules 204 that enhance the flexibility of the SST system 200 by identifying themselves as they are electrically coupled to and decoupled from the driver 202. This flexibility provided by the addition of a relatively inexpensive system component (i.e., the sense resistors 208). As such, the SST modules 204 can be easily added to and removed from the system 200 to accommodate various different lighting or SST configurations without the additional cost associated with intelligent drivers. Moreover, because the SST modules 204 are connected in parallel, they are each driven by the same amount of current. This uniform current distribution across the current strings of the SST modules 204 provides for a more uniform output (e.g., illumination) from the SSTs 206 across the SST system 200.

Figure 3:
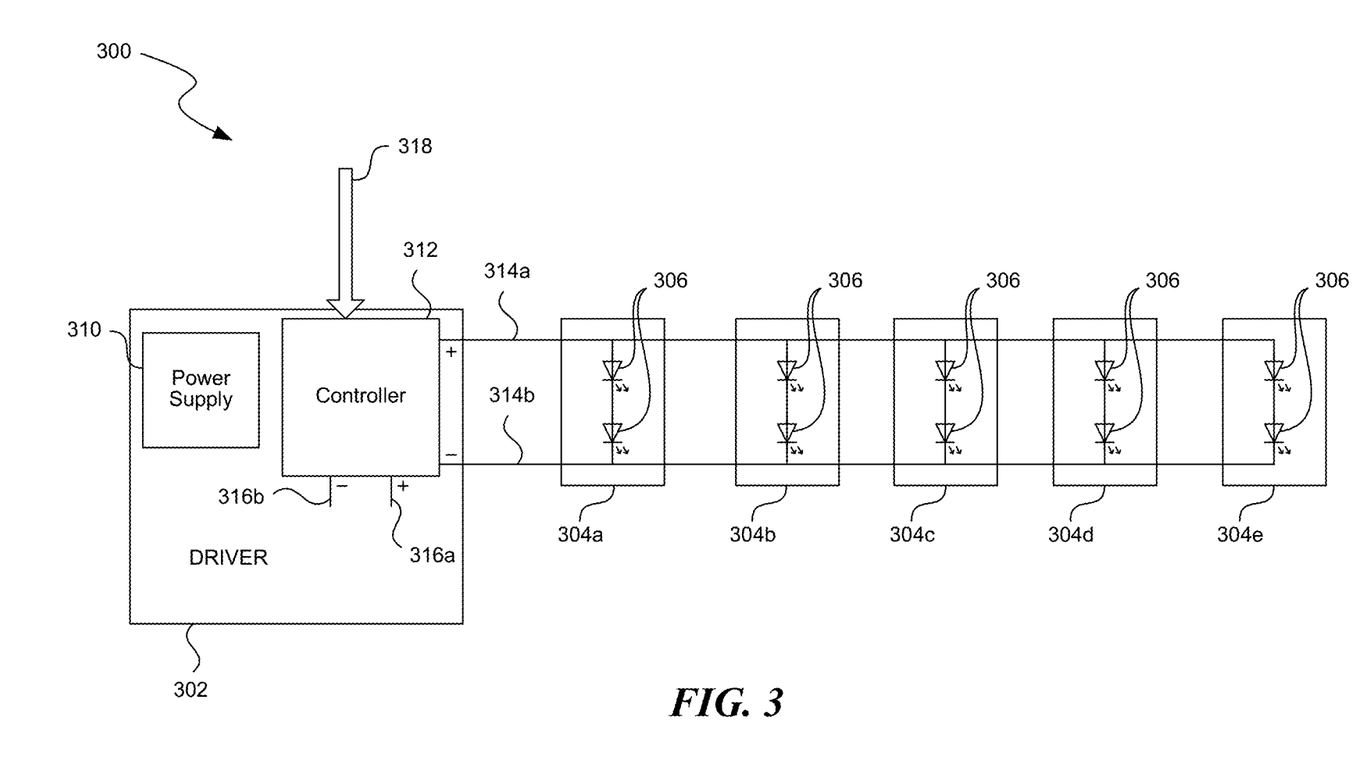
FIG. 3 is a partially schematic circuit diagram of an SST system configured in accordance with other embodiments of the present technology.

FIG. 3 is a partially schematic circuit diagram of an SST system 300 configured in accordance with other embodiments of the present technology. The SST system 300 can include features generally similar to the features of the SST system 200 described above with reference to FIG. 2A. For example, the SST system 300 includes a driver 302 having the power supply 310, a constant current or voltage controller 312 ("controller 312"), and an optional intensity control circuit 318. The controller 312 is electrically coupled to a plurality of SST modules (identified individually as first through fifth SST modules 304a-e, respectively, and referred to collectively as SST modules 304). As shown in FIG. 3, the individual SST modules 304 include one or more SSTs 306 electrically coupled in parallel to the SST channels 314 of the controller 312. However, unlike the SST modules 204 shown in FIG. 2A, none of the SST modules 304 of the SST system 300 shown in FIG. 3 include sense resistors. The constant current controller's sense channels 316 therefore form an open circuit, and the controller 312 detects an infinite sense resistance.

The configuration shown in FIG. 3 causes the driver 302 to operate at maximum current output and drive the SST system 300 as a constant voltage source. In constant voltage systems, performance can be very dependent on forward voltage variations from module 304 to module 304 (e.g., changes in voltage from the first SST module 306a to the second SST module 306b). However, the SST system 300 allows for at least small forward voltage variations that do not substantially affect the uniformity of the emissions because the SST modules 306 are coupled in parallel. For example, if the first SST module 304a operates a lower voltage (e.g., 28 V) than the second SST module 304b (e.g., 38 V), the first SST module 304a is driven by a higher level of current than the second SST module 304b due to the first SST module's inherently lower resistance, and therefore the first and second SST modules 304a and 304b are driven the same way. The same driver 302 can therefore be used to operate in a constant current mode with the self-identifying SST modules 204 (FIG. 2A) or in a constant voltage mode with the SST modules 304 without sense resistors. Accordingly, LED luminaire manufacturers and/or other SST system manufacturers can simply stock one type of driver and two different types of SST modules (i.e., constant current-type module with a sense resistor and constant voltage-type module without a sense resistor) to create various different SST luminaires and other systems without having to match different drivers to the SST modules.

Figure 4:
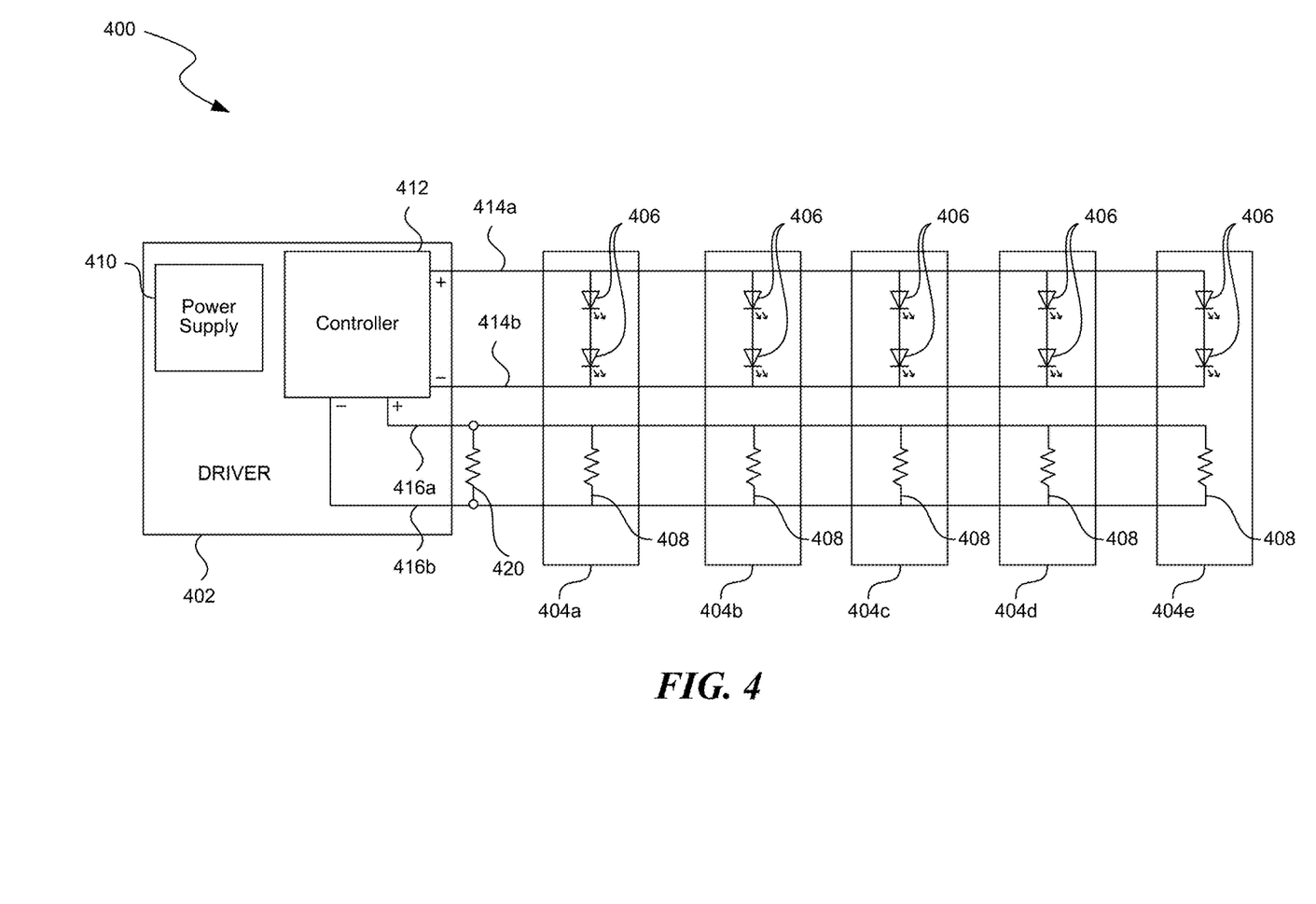
FIG. 4 is a partially schematic circuit diagram of an SST system configured in accordance with further embodiments of the present technology.

FIG. 4 is a partially schematic circuit diagram of an SST system 400 configured in accordance with further embodiments of the present technology. The SST system 400 can include features generally similar to the features of the SST system 200 described above with reference to FIG. 2A. For example, the SST system 400 can include a driver 402 having a power supply 410 and a controller 412 (e.g., a constant current controller) operably coupled to a plurality of SST modules (identified individually as first through fifth SST modules 404a-e, respectively, and referred to collectively as SST modules 404). The SST modules 404 each include one or more SSTs 406 electrically coupled in a parallel circuit to the controller 412 via SST channels 414, and a sense resistor 408 electrically coupled in a separate parallel circuit to the controller 412 via sense channels 416. In operation, the controller 412 can detect the sense resistance across the sense circuit and supply a proportional level of current to the SSTs 406 via the SST channels 414.

In the embodiment illustrated in FIG. 4, the SST system 400 further includes an additional or supplemental resistor 420 that is not a part of an SST module, but is coupled in parallel with the sense resistors 408 (e.g., between the controller 412 and the sense resistor 408 of the first SST module 404a). The supplemental resistor 420 decreases the total sense resistance seen by the constant current controller 212, and therefore causes the driver 402 to supply a corresponding increase in the level of current supplied to the SSTs 406 via the SST channels 414. For example, if the supplemental resistor 420 has a resistance equivalent to that of the other sense resistors 408 in the system 400, the controller 412 will interpret the addition of the supplemental resistor 420 as an additional SST module and increase the current delivered to the SSTs 406 accordingly. Because the SSTs 406 are coupled in parallel across the SST channels 414, the current increase initiated by the supplemental resistor 420 is spread evenly across the SST modules 404. Therefore, without hindering the uniformity of the SST output, the supplemental resistor 420 can be used to manipulate the sense resistance of the SST system 400, and thereby tune the current output to generate a desired level of SST emissions (e.g., a predetermined lumen output).

In various embodiments, the supplemental resistor 420 can be selected based on the resistance necessary to achieve a predetermined increase in current output, and then the supplemental resistor 420 can be coupled between the sense channels 416 as shown in FIG. 4. In other embodiments, the supplemental resistor 420 have an arbitrary resistance, and the operating parameters (e.g., resistance) of the supplemental resistor 420 can be manipulated after the supplemental resistor 420 is attached in parallel with the sense resistors 408. For example, after electrically coupling the supplemental resistor 420 in the parallel circuit, the resistor material can be ablated using laser trimming techniques known in the art to adjust the resistance of the supplemental resistor 420. Current can be supplied to the SSTs 406 before, after, and/or during laser trimming to monitor the effect the changes in resistance have on the SST emissions. As such, the supplemental resistor 420 can be finely tuned to cause a precise level of current to be supplied to the SSTs 406 for a desired emission output (e.g., a specific lumen output). In further embodiments, the supplemental resistor 420 can be a variable resistor and/or other suitable resistor that can be used as an intensity controller to control the constant current controller's current output.

Figure 5:
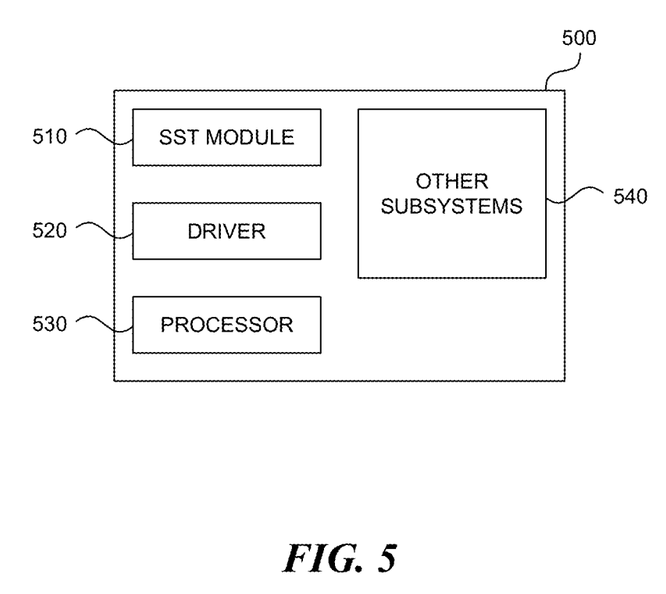
FIG. 5 is a schematic view of a system that includes SST modules configured in accordance with embodiments of the present technology.

Any one of the SST systems described above with reference to FIGS. 2A-4 can be incorporated into any of a myriad of larger and/or more complex systems, a representative example of which is system 500 shown schematically in FIG. 5. The system 500 can include one or more SST modules 510, a driver 520, a processor 530, and/or other subsystems or components 540. The resulting system 500 can perform any of a wide variety of functions, such as backlighting, general illumination, power generations, sensors, and/or other suitable functions. Accordingly, representative systems 500 can include, without limitation, handheld devices (e.g., mobile phones, tablets, digital readers, and digital audio players), lasers, photovoltaic cells, remote controls, computers, and appliances. The system 500 can also be configured as an LED luminaire that replaces fluorescent and/or other lighting structures. Components of the system 500 may be housed in a single unit or distributed over multiple, interconnected units (e.g., through a communications network). The components of the system 500 can also include local and/or remote memory storage devices, and any of a wide variety of computer readable media.

From the foregoing, it will be appreciated that specific embodiments of the technology have been described herein for purposes of illustration, but that various modifications may be made without deviating from the disclosure. For example, the SST systems shown in FIGS. 2A, 3 and 4 each include five SST modules. However, in other embodiments SST systems in accordance with the present technology can include fewer than five SST modules or more than five SST modules depending upon the application and/or any practical limitations of the sense resistors. Certain aspects of the new technology described in the context of particular embodiments may also be combined or eliminated in other embodiments. Additionally, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A solid-state transducer (SST) system, comprising:
a driver; and
at least one SST module electrically coupled to the driver, each SST module including an SST and a sense resistor, wherein the sense resistors of the individual SST modules have at least substantially similar resistance values, wherein— the sense resistors of SST modules are coupled in parallel to the driver in a first parallel circuit, the driver has a sensitivity to resistance value changes of 10 Ω or less, and the driver is configured to measure a sense resistance across the sense resistors and deliver a current across the SSTs based on the sense resistance.

2. The SST system of claim 1 wherein the SSTs of the SST modules are coupled in parallel to the driver in a second parallel circuit.

3. The SST system of claim 1 wherein the driver includes a constant current controller configured to supply current across the first parallel circuit.

4. The SST system of claim 1 wherein the SSTs are light emitting diodes (LEDs).

5. The SST system of claim 1 wherein the individual sense resistors have resistance values within 5% of one another.

6. The SST system of claim 1, further comprising a resistor coupled in parallel with the sense resistors, wherein the resistor is configured to modulate an emission output of the SSTs.

7. A solid-state transducer (SST) system, comprising:
a plurality of SST modules, the individual SST modules including at least one SST and at least one sense resistor, wherein—
the SSTs of the SST modules are electrically coupled together in a first parallel circuit,
the sense resistors of the SST modules are electrically coupled in a second parallel circuit,
the sense resistors of the individual SST modules have sense resistance values within 5% of each other, and
the first and second parallel circuits are configured to be electrically coupled to separate channels of a driver that delivers current to the first parallel circuit proportional to a resistance measured from the second parallel circuit.

8. The SST system of claim 7, further comprising a resistor coupled in parallel with the sense resistors in the second parallel circuit, wherein the resistor is configured to modulate an emission output of the SSTs.

9. The SST system of claim 7 wherein the second parallel circuit has a circuit resistance corresponding to wire, trace, and connection resistance in the second parallel circuit, and wherein the sense resistors have a substantially higher resistance value than the circuit resistance.

10. The SST system of claim 7 wherein the sense resistor in each SST module has a resistance of at least 1 kΩ.

11. A solid-state transducer (SST) system, comprising:
a plurality of SST modules each having at least one SST and a sense resistor, wherein the sense resistors have substantially similar resistance values and are electrically coupled in parallel to each other to provide a sense resistance; and
a driver electrically coupled to the SST modules, wherein the sense resistors are electrically coupled to the driver in a first circuit and the SSTs are electrically coupled to the driver in a second circuit separate from the first circuit, and wherein the driver is configured to measure the sense resistance across the sense resistors and deliver a current level across the SSTs proportional to the sense resistance.

12. The SST system of claim 11 wherein the sense resistor in each SST module has a resistance of at least 1 kΩ.

13. The SST system of claim 11 wherein the individual sense resistors have resistance values within 5% of one another.

14. The SST system of claim 11 wherein the SSTs of the SST modules are electrically coupled to the driver in a parallel circuit.

15. The SST system of claim 11 wherein:
the driver is electrically coupled to the SSTs of the SST modules via SST channels;
the driver is electrically coupled to the sense resistors of the SST modules via sense channels; and
the SSTs are coupled in a parallel circuit across the SST channels.

16. The SST system of claim 11 wherein the driver has a sensitivity to resistance value changes of 10 Ω or less.

17. The SST system of claim 11 wherein the sense resistors are electrically coupled together in a parallel circuit that has a circuit resistance corresponding to wire, trace, and connection resistance in the parallel circuit, and wherein the sense resistors have a substantially higher resistance value than the circuit resistance.

* * * * *